United States Patent [19]

Cunningham

[11] 4,087,757
[45] May 2, 1978

[54] CONSTANT DELAY RESONANT TANK CIRCUIT COMBINATION FOR FREQUENCY DISCRIMINATION

[75] Inventor: Vernon R. Cunningham, Melissa, Tex.

[73] Assignee: Rockwell International Corporation, El Segundo, Calif.

[21] Appl. No.: 755,719

[22] Filed: Dec. 30, 1976

[51] Int. Cl.² ............................................. H03D 3/26
[52] U.S. Cl. ............................... 329/143; 307/233 R; 329/103; 333/76
[58] Field of Search .............................. 329/140–143, 329/103; 333/76; 307/233 R

[56] References Cited

U.S. PATENT DOCUMENTS

| Re. 22,996 | 4/1948 | Crosby | 329/142 X |
| 2,413,913 | 1/1947 | Duke | 329/142 |

Primary Examiner—Siegfried H. Grimm
Attorney, Agent, or Firm—Bruce C. Lutz; L. Lee Humphries; Robert J. Crawford

[57] ABSTRACT

The method of designing a circuit having a substantially constant delay over a given frequency band and having a substantially linear attenuation characteristic or amplitude change characteristic over the same frequency band and the product resulting from such a design approach. One such approach uses a primary tank circuit having a given Q and amplitude response feeding two secondary tank circuits each of which have a higher Q and amplitude response and wherein the resonant points are on either side of the resonant point of the primary tank. By adjusting the Q, amplitude response and resonant frequency of the three tanks, the "delayless" and linear amplitude change characteristics over a given frequency band can be achieved.

2 Claims, 7 Drawing Figures

CONSTANT DELAY RESONANT TANK CIRCUIT COMBINATION FOR FREQUENCY DISCRIMINATION

THE INVENTION

The present invention is generally concerned with filter circuits and more specifically concerned with the design of a filter having a constant delay over a given frequency band while having a linear amplitude or attenuation characteristic.

The primary use of a circuit such as described in the present invention is in a discriminator and the function of any discriminator is to convert a changing frequency to a changing voltage. With this characteristic, a FM modulated carrier, when applied to a properly designed discriminator, provides an output which is identical to the original modulating signal (provided the modulator is linear). While any simple circuit with a non-flat frequency response (such as the single tuned circuit) about the carrier frequency, followed by a diode, will function as a discriminator, most commercial applications require more sophistication.

In most commercial applications, the requirements are:

(1) a maximum possible linearity (that is, equal changes of frequency anywhere across the modulation band should result in equal changes of voltage out of the detector circuit);

(2) minimum differential carrier delay (if there is differential delay at the carrier frequencies, distortion is caused in the demodulated signal);

(3) maximum deviation sensitivity (a maximum differential voltage should be obtained out of the detector circuit with a given change in carrier frequency); and (4) there should be no output d.c. voltage at the carrier frequency when no modulation is applied, or when the carrier is removed.

As mentioned above, a simple single tuned tank followed by a diode, would function as a discriminator but would provide very poor linearity characteristics because the amplitude response of a single tuned circuit does not change linearly with frquency. If two tuned tanks are used instead of one, wherein one is tuned above the carrier frequency and the other below while adding separate detector circuits to each of the tanks, the detector can be arranged to detect opposite polarities and upon adding the two outputs, a so-called "S" curve results. The S-curve produces a much better linearity than one tank, but still is not good enough for many critical applications. To still further improve the linearity, a third tank is added. This third tank is normally tuned to have its resonant frequency between the other two tanks and has a Q chosen so that the non-linear amplitude response thereof cancels out the non-linearities of the other two tanks. This arrangement provides superior linearity over wide bandwidths and has been used in the prior art. However, all known prior art circuits have a differential delay which causes distortion and therefore violates one of the requirements mentioned above. In the prior art, this differential delay has been minimized by adding a delay equalizer to cancel out any delay over the frequency band of interest that the discriminator introduces.

The present invention, on the other hand, introduces an approach in designing the combination of tank circuits such that the Q's and resonant frequencies of the three tuned tanks may be chosen in such a way as to produce both high linearity and minimal delay. Although the approach to connecting these three tank circuits can involve transformers or amplifiers, transformers are usually more expensive and suffer from a lower deviation sensitivity and thus, as illustrated in the present invention, a split amplifier approach is used wherein the output from a primary tuned tank is split and applied to two secondary tuned circuits.

In designing such a combination tank circuit, it will be noted that there are at least seven degrees of freedom in selectig values. There are three tank circuit frequencies to choose and their respective Q's as well as the relative output levels of the two secondary tanks at equal Q values. (As is known, changing the Q, changes the shape of the curve, but changing the gain merely magnifies it.) The interaction of all of these characteristics is a very complicated situation and many considerations must be satisfied simultaneously. In designing the circuit, the center frequency and linearity bandwidth requirements of the combination circuit must be considered while still attempting to obtain the best sensitivity and minimal d.c. output at the carrier frequency input. It is realized that there are other higher order effects which could be considered but are not being considered because of the greatly increased complexity that these effects would add to the solution illustrated.

In view of the above, it is an object of the present invention to illustrate providing delayless operation over a given band of frequencies wherein a linear amplitude response is provided over the same band as well as the method for designing such a circuit.

Other objects and advantages of the present invention will be apparent from a reading of the specification and appended claims in conjunction with the drawings wherein:

FIG. 1 is a schematic diagram of a discriminator incorporating the teachings of the present invention; and FIGS. 2a through 2f comprise a plurality of waveforms illustrating the amplitude responses and delay characteristics of the components comprising the present inventive concept.

DETAILED DESCRIPTION

Figure 1:
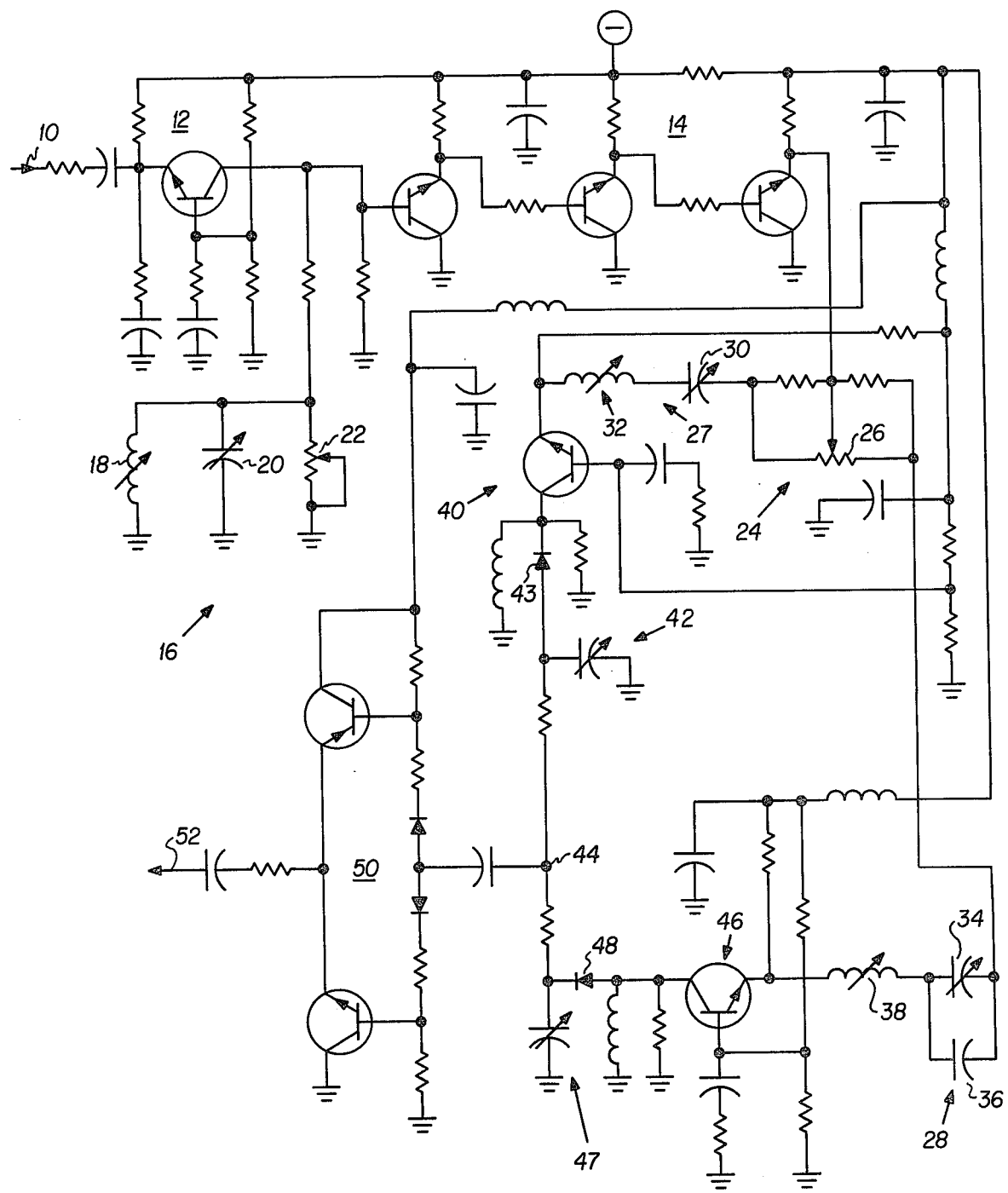

Input signals to be detected are supplied on an input terminal 10 to an amplifier section generally designated as 12 which then supplies signals to a three-stage amplifying section designated as 14 after being passed by a shunt filter generally designated as 16. Shunt filter 16 comprises a variable coil 18, a variable capacitor 20, and a variable resistor 22. The output of amplifier 14 is supplied to a dividing circuit generally designated as 24 having a potentiometer 26, the ends of which supply signals through a pair of series tank circuits 27 and 28. Tank circuit 27 comprises a variable capacitance device 30 and a variable inductance device 32. Tank circuit 28 comprises a first variable capacitance unit 34 and a second parallel capacitor 36 along with a variable inductance device 38.

The output from tank circuit 27 is amplified by an amplifying circuit 40 and detected in a diode detector and filter circuit 42 having a diode 43 before being summed at summing point 44 with signals from the other tank circuit 28 which have been amplified by an amplifier circuit 46 and detected in a diode detector and filter circuit 47 having a diode 48. Output signals from summing point 44 are then passed to a power gain and impedance transformation circuit generally designated as 50 before being output from the discriminator circuit on lead 52.

In the circuit illustrated, the transistor within amplifier 12 and the first transistor of amplifier 14 are both 2N3571's, the upper transistor of amplifier 50 is a 2N5160 while the remaining transistors are all 2N5109's. In tank circuit 16, the inductor 18 is 0.22μh's, capacitor 20 varies from 9 to 35 Pfd's and the variable resistor 22 has a maximum impedance of 500 ohms. In tank circuit 27, inductor 32 is 0.22μh's while capacitor 30 varies from 5 to 18 Pfd's. In tank circuit 28, capacitor 36 is 18 Pfd's while capacitor 34 varies from 9 to 35 Pfd's with inductor 38 is again 0.22μh's. The capacity associated with each of the two detector circuits 42 and 47 is for the purpose of filtering out of the carrier signal so that it will not appear at output 52 and the transistors 40 and 46 are isolation amplifiers for isolating the effects of the detector diodes from the tank circuits, and also for increasing the deviation sensitivity by the gain of the amplifiers.

In FIGS. 2a-2f, the horizontal portion of each of the figures is indicative of changing frequency with the lower frequency on the left and the higher frequency on the right. The vertical component of each of the curves is indicative of either the magnitude in volts or amps of an amplitude of a signal or in number of nano seconds of delay as regards the delay characteristics.

Figure 2A:
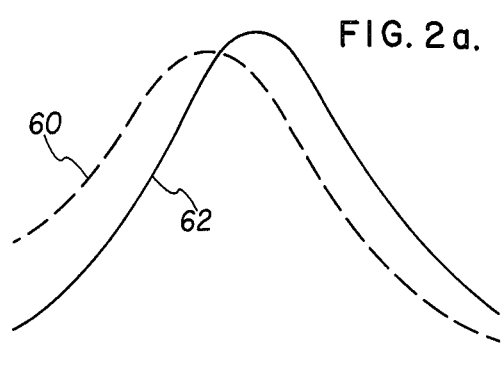

In FIG. 2a, the dashed line curve 60 is indicative of delay of a single tuned tank while the solid line 62 is indicative of amplitude response.

Figure 2B:
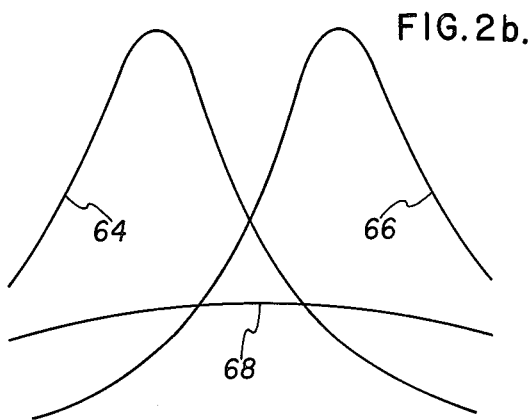

In FIG. 2b, a curve 64 is indicative of the amplitude response of a lower resonant frequency tuned circuit, curve 66 is indicative in amplitude response of a higher resonant frequency tuned circuit and curve 68 is indicative of the primary or intermediate resonant frequency tuned circuit amplitude response.

Figure 2C:
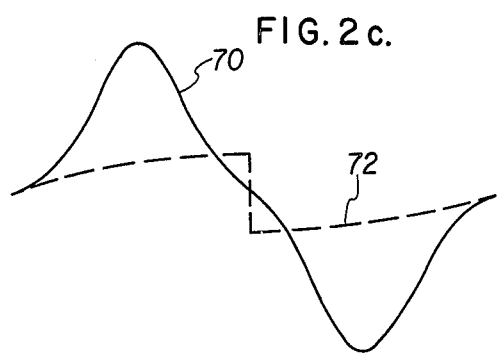

FIG. 2c illustrates a curve 70 which is an amplitude response of two tank circuits after diode subtraction wherein the two tanks have the amplitude responses of 64 and 66 but which combination does not include a primary amplitude response such as 68. The dash line curve 72 is indicative of the amplitude response contribution of the primary circuit indicated by 68 in FIG. 2b.

Figure 2D:
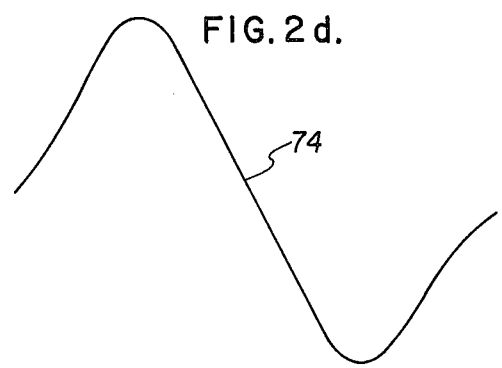

Curve 74 in FIG. 2d is the combined amplitude responses 70 and 72 after diode subtraction.

Figure 2E:
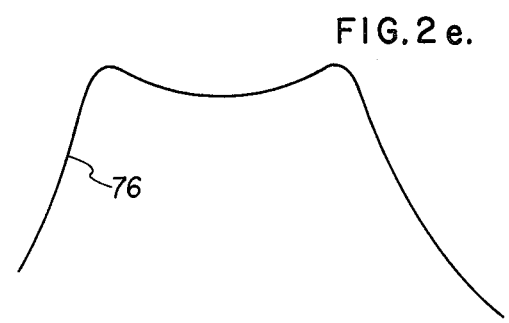

A curve 76 in FIG. 2e represents the delay of the two secondary tanks represented by curve 70.

Figure 2F:
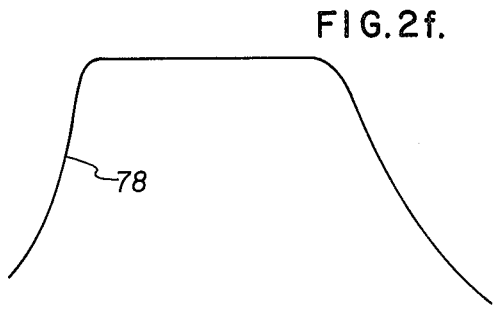

A curve 78 illustrated in FIG. 2f is representative of the delay characteristics of the three tank circuit having an amplitude response characteristic as illustrated in FIG. 2d and designed in accordance with the teachings of this inventive disclosure.

OPERATION

In the operation of the circuit of FIG. 1, a frequency modulated signal is applied at input 10 and the amplitude of the signal passing from amplifier 12 to amplifier 14 is affected by the response of the shunt tank circuit 16 in somewhat the manner shown by curve 68 of FIG. 2b. This signal is divided into two portions by the network 24 wherein the impedance of potentiometer 26 is adjusted to vary the Q of filter 27 and also the magnitude of the signal applied to filter 27 as compared to that applied to filter 28. As illustrated, the filter 28 is the low frequency filter and is represented in FIG. 2b by curve 64 while filter or tank circuit 27 is represented by curve 66. These signals are then passed through the detector diode and filtration circuits 42 and 47 for removing the carrier from the information signal and passing the information signal to the output power gain and impedance transformation amplifier 50. The waveform FIG. 2c illustrates the effects of the positive and negative portions of the signal as passed by the respective filters 27 and 28 to produce the composite curves illustrated in FIGS. 2d and 2f.

As previously indicated, some prior art circuits having high linearity requirements in combination with wide band reception, utilized an additional tank to correct for crossover distortion. This tank was resonant at a point near center frequency and usually had a fairly low Q. However, the prior art circuits did not provide constant delay and were merely used to linearize the response as shown in FIG. 2d. In other words, the prior art circuits required the addition of a delay equalizer to perform properly. The present invention illustrates the approach used to correlate the Q and resonant frequency values along with the amplitude responses necessary to provide constant delay along with linearity of the combination tank circuit.

First trial values of Q and $\omega_o$ are selected. The values may be termed $Q_l$, $Q_h$, and $Q_p$, where the Q values are indicative, respectively, of the low, high, and intermediate frequency filters. The $\omega_{oh}$, $\omega_{ol}$, and $\omega_{op}$ as used in the following equations are the center frequencies or resonant frequencies of the respective filters.

Second, a value is chosen for $f_b$ and $t$ representing a point in a frequency sweep at which the amplitude and delay of the composite filter is to be calculated. In the following equations $f_b$ is a notation of convenience for eventual use in determining the frequency, in the band of frequencies under consideration, at which the differential delay $\tau_a$ is measured with respect to the band center $\omega_c$. It may be thought of, however, as a modulating signal (measured in hertz) which sweeps the carrier across the i.f. bandwidth (Bw) of the discriminator in which the tank circuit is used. As used in the equation, $t$ represents instantaneous time and specifies the instantaneous phase of $f_b$ and hence, the position within the bandwidth Bw to which the modulating signal ($f_b$) has moved the carrier by its modulating action. (I.e., if $t$ is chosen such that the instantaneous amplitude of the chosen value of $f_b$ is O, [sinewave crossover point], the calculation is performed at $\omega_c$, i.f. center frequency.)

Third, the values of $\omega_{a1}$, $\omega_{a2}$, $\tau_{a1}$, and $\tau_{a2}$ are derived from the values selected in the previous step in accordance with the following formulas. As will be realized by those skilled in the art, these four equations can be solved simultaneously by iterative procedures on a computation device and the equations are believed set up in the form for simplest solution by the iterative process.

$$\omega_{a1} - \omega_c = \frac{B_w}{2} \operatorname{Sin}[2\pi f_b(t - \tau_{a1})]$$

$$\omega_{a2} - \omega_c = \frac{B_w}{2} \operatorname{Sin}[2\pi f_b(t - \tau_{a2})]$$

$$\tau_{a1} = \frac{\frac{2}{Q_l \omega_{ol}}\left(1 - \frac{\omega_{ol}^2}{\omega_{a1}^2}\right)}{\frac{1}{Q_l^2} + \left(\frac{\omega_{a1}}{\omega_{ol}} - \frac{\omega_{ol}}{\omega_{a1}}\right)^2} - \frac{\frac{2}{Q_l \omega_{ol}}\left(1 - \frac{\omega_{ol}^2}{\omega_c^2}\right)}{\frac{1}{Q_l^2} + \left(\frac{\omega_c}{\omega_{ol}} - \frac{\omega_{ol}}{\omega_c}\right)^2}$$

$$+ \frac{\frac{2}{Q_p \omega_{op}}\left(1 - \frac{\omega_{op}^2}{\omega_{a1}^2}\right)}{\frac{1}{Q_p^2} + \left(\frac{\omega_{a1}}{\omega_{op}} - \frac{\omega_{op}}{\omega_{a1}}\right)^2} - \frac{\frac{2}{Q_p \omega_{op}}\left(1 - \frac{\omega_{op}^2}{\omega_c^2}\right)}{\frac{1}{Q_p^2} + \left(\frac{\omega_c}{\omega_{op}} - \frac{\omega_{op}}{\omega_c}\right)^2}$$

-continued
$$\tau_{a2} = \frac{\frac{2}{Q_h \omega_{oh}}(1 - \frac{\omega_{oh}^2}{\omega_{a2}^2})}{\frac{1}{Q_h^2} + (\frac{\omega_{a2}}{\omega_{oh}} - \frac{\omega_{ah}}{\omega_{a2}})^2} - \frac{\frac{2}{Q_h \omega_{oh}}(1 - \frac{\omega_{oh}^2}{\omega_c^2})}{\frac{1}{Q_h^2} + (\frac{\omega_c}{\omega_{oh}} - \frac{\omega_{oh}}{\omega_c})^2}$$

$$+ \frac{\frac{2}{Q_p \omega_{op}}(1 - \frac{\omega_{op}^2}{\omega_{a2}^2})}{\frac{1}{Q_p^2} + (\frac{\omega_{a2}}{\omega_{op}} - \frac{\omega_{op}}{\omega_{a2}})^2} - \frac{\frac{2}{Q_p \omega_{op}}(1 - \frac{\omega_{op}^2}{\omega_c^2})}{\frac{1}{Q_p^2} + (\frac{\omega_c}{\omega_{op}} - \frac{\omega_{op}}{\omega_c})^2}$$

In the above equations, the Q values of the various filters are defined as per the usual conventions as $(f_o/Bw)$, where $f_o$ is the center frequency and $Bw$ is the 3 $dB$ bandwidth. In terms of component value for a series resonant circuit, $Q = 1/R\sqrt{L/C}$. Q is referred to as the quality factor. As indicated above, the subscripts, 1, $h$, and $p$ refer to the low, high and primary or intermediate resonant frequency tank circuits and are used to denote the tank with which the Q is associated. $\omega$ denotes the resonant frequency in radians ($\omega = 2\pi f$, where $f$ is the frequency in hertz). The additional subscripts 1, $h$ and $p$ again specify the associated tank. $\omega_c$ is the carrier center frequency in radians and $Bw$ is the carrier bandwidth over which the amplitude and delay characteristics of the demodulated carrier are to be calculated. $\tau_a$ is the differential time delay, referred to the delay at band center ($\omega_c$), of the carrier as it traverses through the primary tank and the secondary tanks. The point in the traversal is determined by the selected parameters $f_b$ and $t$. The subscripts $a1$ and $a2$ refer to the paths through the low and high frequency tanks, respectively. The above definition of $\tau_a$ is altered for $\tau_{a1}$ in that the time delay is referred to the band center delay of the carrier as it traverses through the primary tank and one (the lower frequency tank circuit) of the secondary tanks. The $\omega$ subscripts $a1$ and $a2$ refer, respectively, to the low and high tanks. $\omega_a$ is the instantaneous frequency in radians appearing at the output of the secondary tank. For the condition where the carrier is being swept by a modulating signal $f_b$, $\omega_a$ is not the same frequency at the instantaneous time $t$ as the frequency of the signal applied to the input of the primary tank since the signal has been delayed by delays of the respective circuits.

Fourth, the values of $M_1$ and $M_2$ are determined in accordance with the values obtained from the previous steps in accordance with the following equations wherein M is the instantaneous magnitude of the demodulated signal after the output of the low tank ($M_1$) and the output of the high tank ($M_2$) have been summed. In accordance with this definition $M_1$ is the instantaneous magnitude of the demodulated signal output by the lower frequency secondary tank before summing and a similar definition applies to $M_2$ for the higher frequency secondary tank.

$$M_2 = \frac{1}{\sqrt{1 + Q_1^2(\frac{\omega_{a1}}{\omega_{o1}} - \frac{\omega_{o1}}{\omega_{a1}})^2} \cdot \sqrt{1 + Q_c^2(\frac{\omega_{a1}}{\omega_{op}} - \frac{\omega_{op}}{\omega_{a1}})^2}}$$

$M_2 =$

-continued
$$\frac{1}{\sqrt{1 + Q_h^2(\frac{\omega_{a2}}{\omega_{oh}} - \frac{\omega_{oh}}{\omega_{a2}})^2} \cdot \sqrt{1 + Q_c^2(\frac{\omega_{a2}}{\omega_{op}} - \frac{\omega_{op}}{\omega_{a2}})^2}}$$

Fifth, the values of $\alpha$ and $\beta$ may be obtained from the information obtained in the third step in accordance with the following formulas wherein $\alpha$ and $\beta$ are notations of convenience to simplify the writing of mathematical equations as used in the next step.

$$\alpha = 2\pi f_b(t - \tau_{a1})$$

$$\beta = 2\pi f_b(t - \tau_{a2})$$

Sixth, the composite magnitude (M) and delay ($\tau_a$) from the previously obtained values may be obtained in accordance with the following formulas. As will be realized, the value of M can be determined from the first formula and can be used in the second formula to determine the value of $\gamma$ which is then used in solving the third formula.

$$M^2 = M_1^2 + M_2^2 - 2M_1 M_2 \cos(\beta - \alpha)$$

$$\gamma = \text{Arcsin}\left[\frac{M_1 \sin\alpha - M_2 \sin\beta}{M}\right]$$

$$\tau_a = t - \frac{\gamma}{2\pi f_b}$$

The first through sixth steps above have been used to obtain one point on each of two graphs such as those shown in FIGS. 2d and 2f. The FIG. 2d is the magnitude graph of the composite tank circuit and FIG. 2f is the delay or $\tau_a$ graph of that same tank circuit. Thus, as a seventh step in designing this circuit, new values need to be assigned to $f_b$ and t and the third through seventh steps need to be repeated until enough graph points have been selected to provide a graphical indication of the composite amplitude response and delay characteristics of the originally selected Q and $\omega$ values.

The first through seventh steps above have provided data for a single graph. This process may yield a composite circuit which looks somewhat like the amplitude and delay graphs of FIGS. 2c and 2e. Thus, as an eighth step the first through seventh steps must be repeated in an iterative process enough times until values of Q and $\omega_o$ have been selected which will provide a sufficiently flat delay and linear amplitude characteristic for the design requirements.

While I have illustrated a three tank circuit for producing the composite characteristics represented by graphs in FIGS. 2d and 2f, the method will operate satisfactorily for more than three tanks in the composite circuit. Also, although I have indicated that a preferred specific circuit design is to have the primary tank feed both secondary tanks, the design approach allows other implementations. Further, as illustrated, the amplitude response of the primary tank is lower than the two secondary tanks and its center or resonant frequency is intermediate the two secondary tanks. None of these requirements individually are required to practice the inventive concept and although I believe that the quickest design may be obtained by the approach used herein with the approximate relative values illustrated, I wish to be limited only by the scope of the appended claims.

What is claimed is:

1. A multitank filter including a signal receiving primary resonant tank (p) feeding signals to two secondary resonant tanks (l and h) whose outputs are combined and demodulated to form a single resultant signal and which have a low ($\omega_{ol}$) and a high ($\omega_{oh}$) resonant frequency, respectively, as compared to the resonant frequency ($\omega_{op}$) of the primary tank and also the center frequency ($\omega_c$) of the band of frequencies passed by the multitank filter wherein the $Q_p$ and $Q_l$ and $Q_h$ values of the filter tank circuits as well as their resonant frequencies ($\omega_o$) are obtained in accordance with the following steps for providing a substantially constant delay $\tau_a$ and a substantially linear amplitude response M over a given band of frequencies:

(1) select initial trial values of Q and $\omega_o$ for each tank;
   (2) choose a value for $f_b$ and $t$ to determine a point on each of two ultimate graphs of $\tau_a$ and M wherein $f_b$ is a notation of convenience for determining the frequency of which the differential delay ($\tau_a$) is measured with respect to the center frequency ($\omega_c$) of a band of frequencies and $t$ is the instantaneous time and specifies the instantaneous phase of $f_b$ and the graph of $\tau_a$ having a "y" ordinate of time delay, the graph of M having a "y" ordinate of amplitude and both graphs having an $x$ ordinate of frequency:
   (3) derive $\omega_{a1}$, $\omega_{a2}$, $\tau_{a1}$, $\tau_{a2}$ from the values selected in the previous steps in accordance with the following formulas:

$$\omega_{a1} - \omega_c = \frac{B_w}{2} \sin[2\pi f_b(t - \tau_{a1})]$$

$$\omega_{a2} - \omega_c = \frac{B_w}{2} \sin[2\pi f_b(t - \tau_{a2})]$$

$$\tau_{a1} = \frac{\frac{2}{Q_l \omega_{ol}}(1 - \frac{\omega_{ol}^2}{\omega_{a1}^2})}{\frac{1}{Q_l^2} + (\frac{\omega_{a1}}{\omega_{ol}} - \frac{\omega_{ol}}{\omega_{a1}})^2} - \frac{\frac{2}{Q_l \omega_{ol}}(1 - \frac{\omega_{ol}^2}{\omega_c^2})}{\frac{1}{Q_l^2} + (\frac{\omega_c}{\omega_{ol}} - \frac{\omega_{ol}}{\omega_c})^2}$$

$$+ \frac{\frac{2}{Q_p \omega_{op}}(1 - \frac{\omega_{op}^2}{\omega_{a1}^2})}{\frac{1}{Q_p^2} + (\frac{\omega_{a1}}{\omega_{op}} - \frac{\omega_{op}}{\omega_{a1}})^2} - \frac{\frac{2}{Q_p \omega_{op}}(1 - \frac{\omega_{op}^2}{\omega_c^2})}{\frac{1}{Q_p^2} + (\frac{\omega_c}{\omega_{op}} - \frac{\omega_{op}}{\omega_c})^2}$$

$$\tau_{a2} = \frac{\frac{2}{Q_h \omega_{oh}}(1 - \frac{\omega_{oh}^2}{\omega_{a2}^2})}{\frac{1}{Q_h^2} + (\frac{\omega_{a2}}{\omega_{oh}} - \frac{\omega_{ah}}{\omega_{a2}})^2} - \frac{\frac{2}{Q_h \omega_{oh}}(1 - \frac{\omega_{oh}^2}{\omega_c^2})}{\frac{1}{Q_h^2} + (\frac{\omega_c}{\omega_{oh}} - \frac{\omega_{oh}}{\omega_c})^2}$$

$$+ \frac{\frac{2}{Q_p \omega_{op}}(1 - \frac{\omega_{op}^2}{\omega_{a2}^2})}{\frac{1}{Q_p^2} + (\frac{\omega_{a2}}{\omega_{op}} - \frac{\omega_{op}}{\omega_{a2}})^2} - \frac{\frac{2}{Q_p \omega_{op}}(1 - \frac{\omega_{op}^2}{\omega_c^2})}{\frac{1}{Q_p^2} + (\frac{\omega_c}{\omega_{op}} - \frac{\omega_{op}}{\omega_c})^2}$$

(4) determine the values of $M_1$ and $M_2$ (the instantaneous magnitude of an output signal obtained from the low and high tanks upon demodulation in the point determined by $f_b$ and $t$) in accordance with the following formulas:

$$M_2 = \frac{1}{\sqrt{1 + Q_l^2(\frac{\omega_{a1}}{\omega_{ol}} - \frac{\omega_{ol}}{\omega_{a1}})^2} \cdot \sqrt{1 + Q_c^2(\frac{\omega_{a1}}{\omega_{op}} - \frac{\omega_{op}}{\omega_{a1}})^2}}$$

$$M_2 = \frac{1}{\sqrt{1 + Q_h^2(\frac{\omega_{a2}}{\omega_{oh}} - \frac{\omega_{oh}}{\omega_{a2}})^2} \cdot \sqrt{1 + Q_c^2(\frac{\omega_{a2}}{\omega_{op}} - \frac{\omega_{op}}{\omega_{a2}})^2}}$$

(5) obtain the values of $\alpha$ and $\beta$ in accordance with the following formulas:

$$\alpha = 2\pi f_b(t - \tau_{a1})$$

$$\beta = 2\pi f_b(t - \tau_{a2})$$

(6) obtain the composite magnitude (M) and delay ($\tau_a$) from the previously obtained values in accordance with the following formulas for the point on the graph determined by the above-referenced $f_b$ and $t$:

$$M^2 = M_1^2 + M_2^2 - 2M_1 M_2 \cos(\beta - \alpha)$$

$$\gamma = \text{Arcsin}\left[\frac{M_1 \sin\alpha - M_2 \sin\beta}{M}\right]$$

$$\tau_a = t - \frac{\gamma}{2\pi f_b}$$

(7) assign new values to $f_b$ and $t$ and repeat steps 3 through 7 until enough graph points have been selected to provide an indication of the composite amplitude response and delay characteristics for the values of Q and $\omega$ selected in the first step; and
   (8) repeat steps 1 through 7 until an amplitude response and delay characteristic is obtained which is sufficiently linear and flat, respectively, to fulfill design requirements.

2. A multitank filter comprising, in combination:
   a first tuned circuit means having a first amplitude response, a first Q value $Q_1$ and a resonance at a first frequency $\omega_{o1}$;
   a second tuned circuit means having a second amplitude response, a second Q value $Q_2$ and a resonance at a second frequency $\omega_{o2}$;
   a primary tank circuit means, including signal input means, having a third amplitude response and a third Q value $Q_3$, and resonant at a frequency $\omega_{o3}$ intermediate $\omega_{o1}$ and $\omega_{o2}$;
   means connecting said primary tank circuit means to said first and second tuned circuit means for supplying filtered signals thereto;
   output means, connected to at least one of said first and second tuned circuit means, for providing output signals which, relative to signals supplied to said input means, have a substantially linear amplitude response (M) and a constant differential time delay ($\tau$) over a given frequency band; and
   the linear amplitude response and constant delay at any frequency on a graph of M or $\tau$ respectively is defined by the equations:

$$M = \sqrt{M_1^2 + M_2^2 - 2M_1 M_2 \cos(\beta - \alpha)}, \text{ and}$$

$$\tau_a = t - (\gamma/2\pi f_b).$$

where M is the linear amplitude response at a given frequency,
$M_1$ is the instantaneous magnitude of the demodulated signal output by said first tuned circuit means, $M_2$ is the instantaneous magnitude of the demodulated signal output by said second tuned circuit means, $\alpha$ is a notation of convenience and equals $2\pi f_b(t-\tau_{a1})$, where $f_b$ is a notation of convenience for determining the frequency at which the differential time delay ($\tau_a$) is measured with respect to the center frequency ($\omega_c$) of a band of frequencies, $t$ is the instantaneous time and specifies the instantaneous phase of $f_b$, and $\tau_{a1}$ is the differential time delay referred to the band center delay of the carrier signal as it traverses through the primary tank and the (lower frequency) first tuned circuit means, $\beta$ is a further notation of convenience used to simplify the writing of mathematical equations and equals $2\pi f_b(t-\tau_{a2})$ with the identical definitions applying as used in conjunction with $\alpha$ and with $\tau_{a2}$ being the time differential delay of the higher frequency or second tuned circuit means, $\tau$ is the differential time delay at any given frequency on the graph, and $\gamma$ is defined as equaling arc $\sin(M_1 \sin \alpha - M_2 \sin \beta / M)$.

* * * * *

UNITED STATES PATENT AND TRADEMARK OFFICE
CERTIFICATE OF CORRECTION

PATENT NO. : 4,087,757
DATED : 2 May 1978
INVENTOR(S) : Vernon R. Cunningham

It is certified that error appears in the above-identified patent and that said Letters Patent are hereby corrected as shown below:

Column 1, line 44, delete "frquency" and substitute therefor --frequency--.
Column 2, line 12, delete "selectig" and substitute therefor --selecting--.
Column 2, line 29, after "illustrate" insert --a circuit--.

Column 3, line 13, delete "with" and substitute therefor --and--.
Column 3, line 16, after "out" delete "of".

Column 5, lines 61-66, in equation, change $M_2$ to $M_1$ so that the equation reads as follows:

$$M_1 = \frac{1}{\sqrt{1 + Q_1^2 \left(\frac{\omega_{a1}}{\omega_{o1}} - \frac{\omega_{o1}}{\omega_{a1}}\right)^2} \cdot \sqrt{1 + Q_c^2 \left(\frac{\omega_{a1}}{\omega_{op}} - \frac{\omega_{op}}{\omega_{a1}}\right)^2}}$$

Column 6, line 42, delete "of" and substitute therefor --for--.

UNITED STATES PATENT AND TRADEMARK OFFICE
CERTIFICATE OF CORRECTION

PATENT NO. : 4,087,757
DATED : 2 May 1978
INVENTOR(S) : Vernon R. Cunningham

It is certified that error appears in the above-identified patent and that said Letters Patent are hereby corrected as shown below:

Column 7, lines 61-66, in equation, change $M_2$ to $M_1$ so that the equation reads as follows:

$$M_1 = \frac{1}{\sqrt{1 + Q_1^2 \left(\frac{\omega_{al}}{\omega_{ol}} - \frac{\omega_{ol}}{\omega_{al}}\right)^2} \cdot \sqrt{1 + Q_c^2 \left(\frac{\omega_{al}}{\omega_{op}} - \frac{\omega_{op}}{\omega_{al}}\right)^2}}$$

Signed and Sealed this

Seventeenth Day of October 1978

[SEAL]

Attest:

RUTH C. MASON
Attesting Officer

DONALD W. BANNER
Commissioner of Patents and Trademarks